US006750470B1

(12) United States Patent
Wilson

(10) Patent No.: US 6,750,470 B1
(45) Date of Patent: Jun. 15, 2004

(54) ROBUST FIELD EMITTER ARRAY DESIGN

(75) Inventor: Colin Wilson, Niskayuna, NY (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 10/248,030

(22) Filed: Dec. 12, 2002

(51) Int. Cl.[7] .................... H01L 29/06

(52) U.S. Cl. .................... 257/10; 257/11; 257/173; 257/355; 257/529; 257/546; 438/20; 438/22; 438/48

(58) Field of Search .................... 257/10; 438/20, 438/22, 48

(56) References Cited

U.S. PATENT DOCUMENTS 5,359,256 A * 10/1994 Gray .................... 313/169
5,528,108 A * 6/1996 Cisneros .................... 315/169.3
5,550,435 A * 8/1996 Kuriyama et al. .................... 315/169.1
5,561,340 A 10/1996 Jin et al.
5,598,056 A 1/1997 Jin et al.
5,646,479 A 7/1997 Troxell
5,656,514 A 8/1997 Ahlgren et al.
5,656,525 A 8/1997 Lin et al.
5,688,707 A 11/1997 Lee et al.
5,690,530 A 11/1997 Jin et al.
5,702,281 A 12/1997 Huang et al.
5,704,820 A 1/1998 Chandross et al.
5,717,278 A 2/1998 Bartha et al.
5,731,597 A 3/1998 Lee et al.
5,828,163 A 10/1998 Jones et al.
5,828,288 A 10/1998 Jones et al.
5,844,370 A * 12/1998 Cathey et al. .................... 315/169
5,857,884 A 1/1999 Zimlich
5,863,233 A 1/1999 Porter et al.
5,872,019 A 2/1999 Lee et al.
5,930,590 A 7/1999 Busta
5,939,833 A 8/1999 Song et al.
5,969,473 A 10/1999 Huang et al.
6,007,396 A 12/1999 Williams
6,008,064 A 12/1999 Busta
6,087,193 A * 7/2000 Gray .................... 438/20
6,148,061 A 11/2000 Shefer et al.
6,204,549 B1 * 3/2001 Igel et al. .................... 257/529
6,232,705 B1 5/2001 Forbes et al.
6,239,538 B1 5/2001 Konuma
6,266,034 B1 * 7/2001 Cathey et al. .................... 345/74.1
6,356,250 B1 * 3/2002 Cathey et al. .................... 345/75.2
6,417,605 B1 * 7/2002 Hofmann et al. .................... 313/309
6,428,378 B2 * 8/2002 Tjaden et al. .................... 445/24
6,440,763 B1 * 8/2002 Hsu .................... 438/20
6,445,123 B1 * 9/2002 Tjaden et al. .................... 313/495
6,448,701 B1 * 9/2002 Hsu .................... 313/309

* cited by examiner

*Primary Examiner*—David Nelms
*Assistant Examiner*—Andy Huynh
(74) *Attorney, Agent, or Firm*—Foley & Lardner LLP

(57) ABSTRACT

There is provided a field emitter device formed over a semiconductor substrate. The field emitter device includes at least one field emitter tip disposed over the substrate, and a conducting gate electrode layer disposed over the substrate. The field emitter device also includes a protective electronic component disposed over and integral to the substrate and electrically connecting the conducting gate electrode layer to the substrate such that if the conducting gate electrode layer experiences a voltage greater than a breakdown voltage of the field emitter device, the protective electronic component conducts current between the conducting gate electrode layer and the substrate.

6 Claims, 6 Drawing Sheets

ROBUST FIELD EMITTER ARRAY DESIGN

BACKGROUND OF THE INVENTION

This invention is related generally to field emitter arrays.

Field emitter arrays (FEAs) generally include an array of field emitter devices. Each emitter device, when properly driven, can emit electrons from the tip of the device. Field emitter arrays have many applications, one of which is in field emitter displays (FEDs), which can be implemented as a flat panel display. In addition to flat panel displays, FEAs have applications as electron sources in microwave tubes, X-ray tubes, and other microelectronic devices.

FIG. 1 illustrates a portion of a conventional FEA. The field emitter device shown in FIG. 1 is often referred to as a "Spindt-type" FEA. It includes a field emitter tip 12 formed on a semiconductor substrate 10. Refractory metal, carbide, diamond and silicon tips, silicon carbon nanotubes and metallic nanowires are some of the structures known to be used as field emitter tips 12. The field emitter tip 12 is adjacent to an insulating layer 14 and a conducting gate layer 16. By applying an appropriate voltage to the conducting gate layer 16, the current to the field emitter tip 12 passing through semiconductor substrate 10 is controlled.

FEAs in many prior art designs are susceptible to failure due to gate-to-substrate short circuiting and gate to tip arcing. Typically, failure occurs from (i) an overvoltage on the gate and bulk breakdown of the insulating layer 14 that allows current to punch through or flash over the insulating layer 14 of the gate and creates a high current arc that destroys the entire device or (ii) an overvoltage on the gate that causes an arc to develop between the grid and tip.

A large number of field emitter tips are typically supplied current by a single conducting gate layer. Thus, when short circuit failure occurs, all the emitter tips corresponding to a particular gate layer are affected, and failure is catastrophic.

SUMMARY OF THE INVENTION

In accordance with one aspect of the present invention, there is provided a field emitter device disposed over a semiconductor substrate. The field emitter device comprises: at least one field emitter tip disposed over the substrate; a conducting gate electrode layer disposed over the substrate; a protective electronic component disposed over and integral to the substrate and electrically connecting the conducting gate electrode layer to the substrate such that if the conducting gate electrode layer experiences a voltage greater than a breakdown voltage of the field emitter device, the protective electronic component conducts current between the conducting gate electrode layer and the substrate.

In accordance with another aspect of the present invention, there is provided a method of forming a field emitter device formed over a semiconductor substrate. The method comprises: forming at least one field emitter tip over the substrate; forming a conducting gate electrode layer over the substrate; forming a protective electronic component over and integral to the substrate and electrically connecting the conducting gate electrode layer to the substrate such that if the conducting gate electrode layer experiences a voltage greater than a breakdown voltage of the field emitter device, the protective electronic component conducts current between the conducting gate electrode layer and the substrate.

DETAILED DESCRIPTION OF THE PREFERRED EMBODIMENTS

Reference will now be made in detail to presently preferred embodiments of the present invention. Wherever possible, the same reference numbers will be used throughout the drawings to refer to the same or like parts.

The present inventor has realized that the problem of catastrophic failure from gate to substrate arcing and gate-to-tip arcing can be avoided by incorporating a protective electronic component integral to the FEA. The protective electronic component acts to channel current to the substrate as soon as a safe gate voltage level is exceeded. In this manner when the voltage to the gate begins to exceed a safe level, i.e., the breakdown voltage of the device, the protective electronic component starts to draw current and the gate voltage is prevented from further increase.

Beneficially, the protective electronic component is integral to the substrate on which the FEA is formed, and thus can be formed using standard electronic bulk manufacturing processes. In one embodiment of the invention, the protective electronic component can be fabricated adjacent the insulating layer of the gate and under a conducting gate electrode layer of the gate. In another embodiment, the protective electronic component is formed remote from the gate electrode layer.

Figure 2:
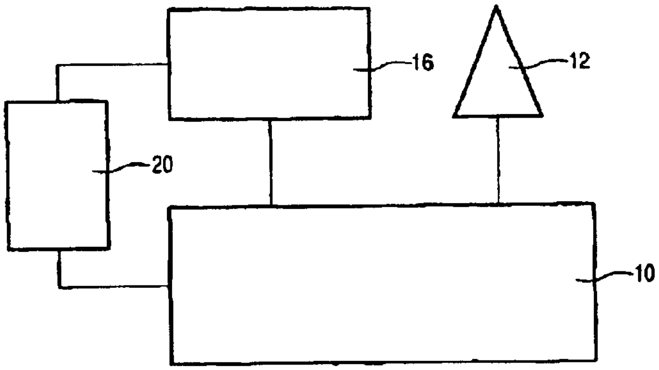
FIG. 2 is a schematic of a portion of a field emitter device according to a preferred embodiment of the invention.

FIG. 2 is a schematic of a portion of a field emitter device according to a preferred embodiment of the invention. The field emitter device includes a substrate 10, which may comprise a semiconductor material. A field emitter tip 12 is disposed over the substrate 10. A conducting gate electrode layer 16 is disposed over the substrate. In general the conducting gate electrode layer 16 does not contact the substrate 10 directly, but is separated from the substrate by an insulating layer which insulates the gate electrode layer 16 from the substrate 10. The field emitter device also includes a protective electronic component 20 disposed over and integral to the substrate 10. The protective electronic component 20 electrically connects the conducting gate electrode layer 16 to the substrate 10 such that when the gate electrode layer 16 experiences a voltage greater than a breakdown voltage, the protective electronic component 20 conducts current between the conducting gate electrode layer 16 and the substrate 10.

FIG. 2 (and FIGS. 3 and 6 discussed below) illustrate a single field emitter tip for ease of illustration. In implementation, the FEA has an array of field emitter tips where the current to each tip is controlled by the conducting gate electrode layer 16. In any event, the field emitter device has at least one field emitter tip 12.

The protective electronic component 20 may comprise, for example, at least one zener diode that allows current to pass from the gate electrode layer 16 to the substrate 10 when the gate electrode layer 16 voltage exceeds a breakdown voltage. The protective electronic component 20 may comprise, for example, a back-to-back zener diode voltage clamp.

The protective electronic component 20 may alternatively comprise a varistor, or any other electronic component that functions to allows current to pass from the gate electrode layer 16 to the substrate 10, when the gate electrode layer 16 voltage exceeds a breakdown voltage.

Figure 1:
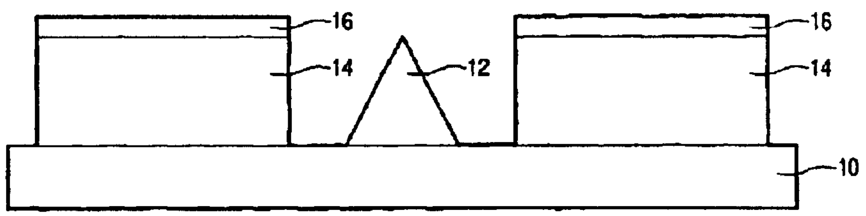
Fig. 1 Prior Art
FIG. 1 is a side cross sectional view of a prior art field emitter device.

Preferably the protective electronic component 20 is formed as part of an intervening layer (not shown in FIG. 1), which is disposed between the gate electrode layer 16 and the substrate 10. In this case the protective electronic component 20 is formed proximate the gate electrode layer 16. Arranging the protective electronic component 20 proximate the gate electrode layer 16 prevents any high voltage transients formed in leads or cables connected to the device from destroying the device. Assembly is also easier when the protective electronic component 20 is arranged proximate the gate electrode layer 16. Alternatively, the protective electronic component 20 may be formed remote from the gate electrode layer 16.

Figure 3:
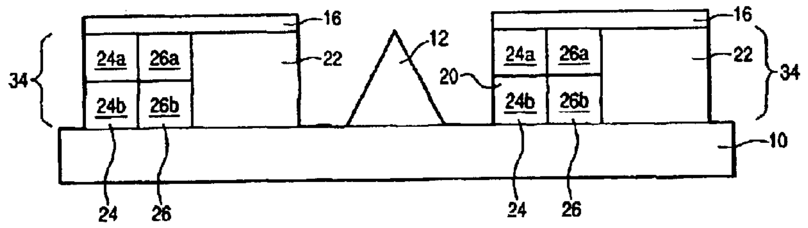
FIG. 3 illustrates a side view of a field emitting device according to a preferred embodiment.

FIG. 3 illustrates a side view of a field emitting device according to a preferred embodiment. The field emitting device of FIG. 3 in a similar fashion to the schematic of FIG. 2 includes a substrate 10, which may comprise a semiconductor material. At least one field emitter tip 12 is disposed over the substrate 10. A conducting gate electrode layer 16 is disposed over the substrate. The conducting gate electrode layer 16 is separated from the substrate 10 by an intervening layer 34. The field emitter device also includes a protective electronic component 20 disposed over and integral to the substrate 10. The protective electronic component 20 electrically connects the conducting gate electrode layer 16 to the substrate 10 such that when the gate electrode layer 16 experiences a voltage greater than a breakdown voltage the protective electronic component 20 conducts current between the conducting gate electrode layer 16 and the substrate 10.

The substrate 10, may comprise a semiconductor material. Exemplary semiconductor materials include silicon, germanium and III–V semiconductor materials such as GaAs, but others may be used. The substrate, may also comprise an insulating material, such as glass or plastic for example, with a semiconductor layer formed on the insulating material. In this case the substrate will comprise a semiconductor material, but will also comprise an underlying insulating (or conducting) material. Preferably, the substrate 10 is doped such that the gate 16, when an appropriate voltage is applied, will allow current to flow to the at least one emitter tip 12 through the substrate. Thus, the gate 16 controls the flow of current to the emitter tip.

In this embodiment, the protective electronic component 20 is formed as part of the intervening layer 34 located between the conducting gate layer 16 and the substrate 10. Specifically, the protective electronic component 20 is disposed within a first section of the intervening layer 34 laterally adjacent a second section 22, comprising insulating material. The insulating material may comprise, for example, silicon dioxide, silicon nitride, or silicon oxynitride.

The second section 22 insulating material may be formed by blanket depositing an insulating material, by any suitable technique, such as CVD or sputtering, followed by patterning the insulating material. Patterning the first insulating material may be performed using photolithographic techniques, which are well known in the art. Alternatively, the second section 22 insulating material may be formed by growing an insulating material directly on the substrate 10, followed by patterning the insulating material, or by selectively growing the insulating material on the substrate.

If the second section 22 is formed by growing a material on the substrate, the second section 22 may be formed by exposing the substrate 10 to an oxidizing atmosphere. For example, if the substrate 10 is silicon, the second section 22 may be formed by exposing the substrate to oxygen gas or water vapor.

The second section 22 may be formed to a thickness of between about 0.5 $\mu$m and 5 $\mu$m, and more preferably between about 0.5 $\mu$m and 1.5 $\mu$m. The thickness of the second section 22 will depend upon the particular device formed, and it should be thick enough to support an appropriate gate voltage. The thickness of the second section 22 may be, for example, about 2.5 $\mu$m. The second section 22 may be formed prior to the protective electronic component 20 of the first section or afterwards or at the same time.

The protective electronic component 20 of the first section may be, for example, a back-to-back zener voltage clamp comprising doped semiconductor material. In this case, the first section may comprise a third section 24 and a fourth section 26 forming the respective zener diodes of the back-to-back zener voltage clamp. The third section 24 comprises a third section top portion 24*a* and a third section bottom portion 24*b*, which are oppositely doped. For example, the top portion 24*a* may comprise p-type semiconductor material, while the bottom portion 24*b* comprises n-type semiconductor material. The zener diode of the fourth portion 26 has opposite polarity to that of the third portion 24. The fourth portion 26 may thus have a fourth portion top portion 26*a* comprising n-type semiconductor material, while the fourth portion bottom portion 26*b* comprises p-type semiconductor material.

The protective electronic component 20 of the first section may be formed as follows. Semiconductor material for forming the bottom portions 24*b* and 26*b* is deposited, and patterned if necessary, for example as n-doped material. The bottom portion 24*b* is masked with an ion implant mask, such as photoresist, and the bottom portion 26*b* is implanted with appropriate ions to make the bottom portion 26*b* p-type. Alternatively, the semiconductor material is deposited undoped, and a p-type and n-type implants are performed with appropriate masking. As another alternative, p-doped material is deposited and the bottom portion 26*b* is masked with an ion implant mask, such as photoresist, and the bottom portion 24*b* is implanted with appropriate ions to make the bottom portion 24*b* n-type.

Top portions 24*a* and 26*a* are then formed in a similar fashion to the bottom portions, except that 24*a* and 26*a* are formed to be p-type and n-type, respectively.

The conducting gate layer 16 may be formed by depositing a conducting material on the intervening layer 34. The conducting material may be a metal, such as a refractory metal, for example. The conducting material may be one of molybdenum, niobium, chromium and hafnium, or combinations of these materials, for example. Other conducting materials may be used as are known in the art. The conducting material may be deposited by physical vapor deposition techniques, such as evaporation or sputtering, or by chemical vapor deposition (CVD) techniques. The conducting material may be deposited in the region between the intervening layer 34, in addition to on the intervening layer 34 especially if the conducting gate layer 16 is much thinner than the intervening layer 34. The conducting gate layer 16 may be formed to a thickness of between about 0.1 $\mu$m and 1 $\mu$m, for example. The thickness of the conducting gate layer 16 may be, for example, about 0.4 $\mu$m. The thickness of the conducting gate layer 16 will be dependent upon the particular device formed, and should be thick enough to allow conduction of the gate current, as is known in the art.

The conducting gate layer 16 and intervening layer 34 may be formed by forming the intervening layer 34 and then the conducting gate layer 16 on the intervening layer 34, followed by photolithographically patterning both layers. Alternatively, the intervening layer 34 may be patterned first followed by patterning the conducting gate layer 16.

The voltage to the conducting gate layer 16 may be controlled by other circuitry (not shown) on the substrate 10 as known in the art.

The field emitter tip 12 may be formed as a refractory metal tip, a nanotube, a nanowire or other types of emitter tips. If the field emitter tip 12 is formed as a refractory metal tip, the tip 12 may be formed by the so-called "Spindt process". An example of a Spindt process for depositing a refractory metal tip, for example, is provided in U.S. Pat. No. 5,731,597 to Lee et al, which is incorporated by reference. If the emitter tip 12 comprises a refractory metal, the emitter tip 12 may be formed of molybdenum, niobium, or hafnium, or combinations of these materials, for example.

The field emitter tip 12 may also be formed as a nanotube or nanowire. For example, the emitter tip 12 may be formed as a carbon nanotube or a nanowire. The nanowire may be ZnO, refractory metal, refractory metal carbide, or diamond, for example. Carbon nanotubes may be formed using electric discharge, pulsed laser ablation or chemical vapor deposition, for example. Nanowires can be grown by several known methods, but preferably using electro-deposition.

Figure 4:
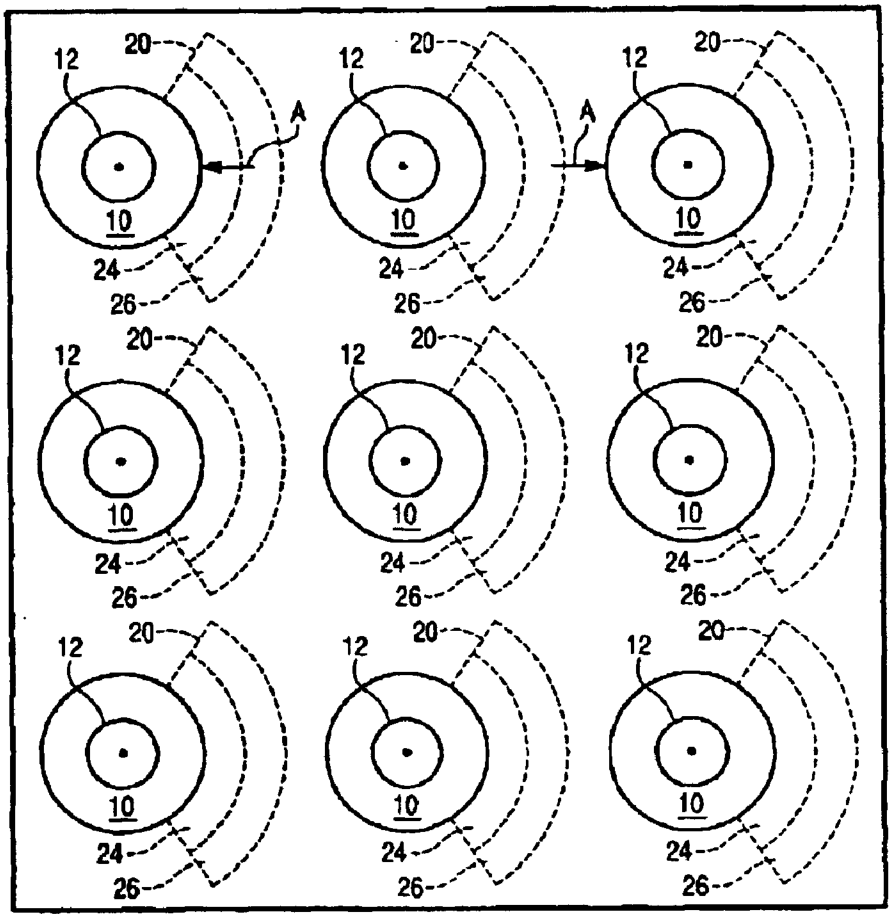
FIG. 4 is a top view of the field emitter device of FIG. 3 and further regions of the field emitter device.

FIG. 4 is a top view of the field emitter device of FIG. 3 and further regions of the field emitter device. FIG. 3 shows a portion of FIG. 4 along the line A—A. The dashed lines in FIG. 4 denote the regions of the protective electronic component 20 of the first section which includes the third section 24 and fourth section 26. In FIG. 4, each of the field emitter tips 12 is adjacent to a section of the protective electronic component 20 proximate the tip 12. Alternatively, only one or some of the field emitter tips 12 may be adjacent to a section of the protective electronic component 20.

Figure 5:
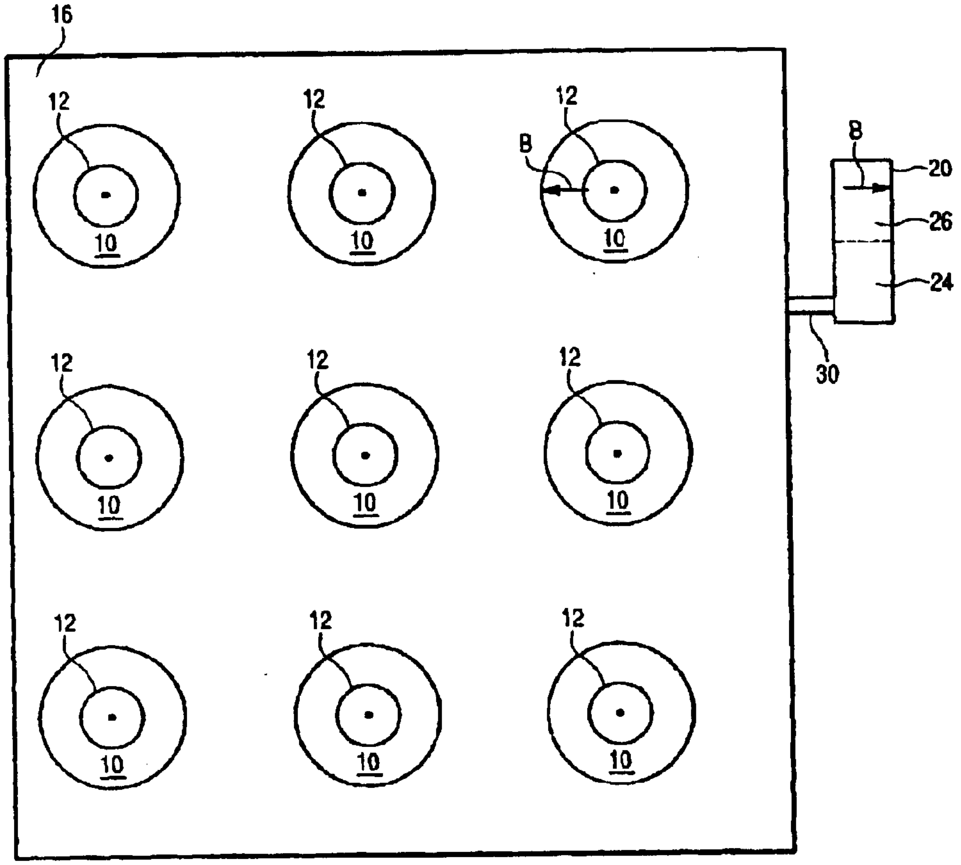
FIG. 5 is a top view of a field emitter device according to another preferred embodiment of the invention.

FIG. 5 is a top view of a field emitter device according to another preferred embodiment. In the embodiment of FIG. 5, the protective electronic component 20 is remote from the conducting gate electrode layer 16. The conducting gate electrode layer 16 is electrically connected to the protective electronic component 20 via a conducting line 30.

Figure 6:
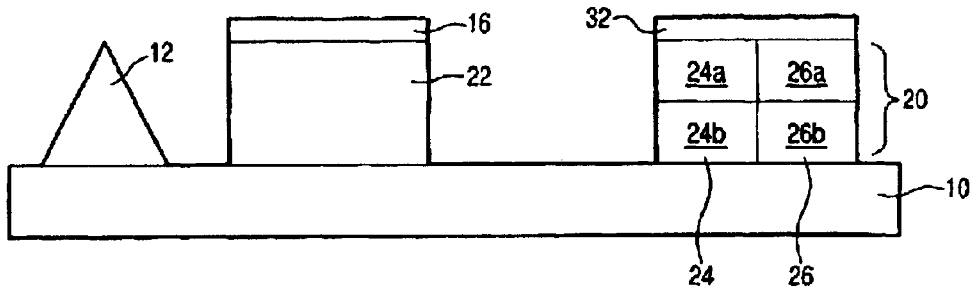
FIG. 6 is a side view of the field emitter device of FIG. 5 along the line B—B in FIG. 5.

FIG. 6 is a side view of the field emitter device of FIG. 5 along the line B—B in FIG. 5. In this case, the third and fourth sections 24 and 26 of the protective electronic component 20 are located remote from the conducting gate electrode layer 16. The third and fourth sections 24 and 26 are all covered by a protective electronic component conducting layer 32 which may be formed at the same time as the conducting electrode layer 16, and the conducting line 30 (not shown in FIG. 6).

FIGS. 5 and 6 illustrate a single protective electronic component remote from the gate conducting electrode layer 16. Alternatively, the gate conducting electrode layer 16 may be connected to several protective electronic component located remotely.

While the invention has been described in detail and with reference to specific embodiments thereof, it will be apparent to one skilled in the art that various changes and modifications can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A field emitter device disposed over a semiconductor substrate comprising:

at least one field emitter tip disposed over the substrate;

a conducting gate electrode layer disposed over the substrate;

a protective electronic component disposed over and integral to the substrate and electrically connecting the conducting gate electrode layer to the substrate such that if the conducting gate electrode layer experiences a voltage greater than a breakdown voltage of the field emitter device, the protective electronic component conducts current between the conducting gate electrode layer and the substrate; and an intervening layer between the conducting gate electrode layer and the substrate, wherein the protective electronic component is disposed within a first section of the intervening layer, wherein the intervening layer further comprises an insulating material in a second section laterally adjacent the first section and to the at least one field emitter tip, wherein the first section comprises a third section and a fourth section laterally adjacent the third section, the third section comprising a third section top portion comprising p-type semiconductor material and a third section bottom portion comprising n-type semiconductor material, the fourth section comprising a fourth section top portion comprising n-type semiconductor material and a fourth section bottom portion comprising p-type semiconductor material.

2. A method of forming a field emitter device formed over a semiconductor substrate comprising:

forming at least one field emitter tip over the substrate;

forming a conducting gate electrode layer over the substrate;

forming a protective electronic component over and integral to the substrate and electrically connecting the conducting gate electrode layer to the substrate such that if the conducting gate electrode layer experiences a voltage greater than a breakdown voltage of the field emitter device, the protective electronic component conducts current between the conducting gate electrode layer and the substrate; and forming an intervening layer between the conducting gate electrode layer and the substrate, wherein the protective electronic component is disposed within a first section of the intervening layer, wherein the forming an intervening layer further comprises forming an insulating material in a second section laterally adjacent the first section, wherein the forming a first section further comprises: forming a third section and a fourth section laterally adjacent the third section, the third section comprising a third section top portion comprising p-type semiconductor material and a third section bottom portion comprising n-type semiconductor material, the fourth section comprising a fourth section top portion comprising n-type semiconductor material and a fourth section bottom portion comprising p-type semiconductor material.

3. The method of claim 2, wherein the forming a third section top portion and a fourth section top portion further comprises:

depositing a semiconductor material and selectively implanting n-type ions into the semiconductor material to form the fourth section top portion.

4. The method of claim 2, wherein the forming a third section bottom portion and a fourth section bottom portion further comprises:

depositing a semiconductor material and selectively implanting p-type ions into the semiconductor material to form the fourth section bottom portion.

5. A field emitter device disposed over a semiconductor substrate comprising:

at least one field emitter tip disposed over the substrate;

a conducting gate electrode layer disposed over the substrate;

a protective electronic component disposed over and integral to the substrate and electrically connecting the conducting gate electrode layer to the substrate such that if the conducting gate electrode layer experiences a voltage greater than a breakdown voltage of the field emitter device, the protective electronic component conducts current between the conducting gate electrode layer and the substrate; and an intervening layer between the conducting gate electrode layer and the substrate, wherein the protective electronic component is disposed within a first section of the intervening layer, wherein the intervening layer further comprises a second section laterally adjacent the first section and to the at least one field emitter tip, wherein the first section comprises a third section and a fourth section laterally adjacent the third section, the third section comprising a third section top portion comprising p-type semiconductor material and a third section bottom portion comprising n-type semiconductor material, the fourth section comprising a fourth section top portion comprising n-type semiconductor material and a fourth section bottom portion comprising p-type semiconductor material.

6. A method of forming a field emitter device formed over a semiconductor substrate comprising:

forming at least one field emitter tip over the substrate;

forming a conducting gate electrode layer over the substrate;

forming a protective electronic component over and integral to the substrate and electrically connecting the conducting gate electrode layer to the substrate such that if the conducting gate electrode layer experiences a voltage greater than a breakdown voltage of the field emitter device, the protective electronic component conducts current between the conducting gate electrode layer and the substrate; and forming an intervening layer between the conducting gate electrode layer and the substrate, wherein the protective electronic component is disposed within a first section of the intervening layer, wherein the forming an intervening layer further comprises forming a second section laterally adjacent the first section, wherein the forming a first section further comprises: forming a third section and a fourth section laterally adjacent the third section, the third section comprising a third section top portion comprising p-type semiconductor material and a third section bottom portion comprising n-type semiconductor material, the fourth section comprising a fourth section top portion comprising n-type semiconductor material and a fourth section bottom portion comprising p-type semiconductor material.

* * * * *